United States Patent
He et al.

(10) Patent No.: US 11,537,306 B2
(45) Date of Patent: Dec. 27, 2022

(54) COLD DATA DETECTOR IN MEMORY SYSTEM

(71) Applicant: MICRON TECHNOLOGY, INC., Boise, ID (US)

(72) Inventors: Yuan He, Boise, ID (US); Daigo Toyama, Fujisawa (JP)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 17/200,421

(22) Filed: Mar. 12, 2021

(65) Prior Publication Data
US 2022/0291853 A1 Sep. 15, 2022

(51) Int. Cl.
*G06F 3/06* (2006.01)
*G06F 12/123* (2016.01)

(52) U.S. Cl.
CPC .......... *G06F 3/0643* (2013.01); *G06F 3/0604* (2013.01); *G06F 3/0647* (2013.01); *G06F 3/0679* (2013.01); *G06F 12/123* (2013.01)

(58) Field of Classification Search
CPC .... G06F 3/0604; G06F 3/0647; G06F 3/0679; G06F 12/2021
See application file for complete search history.

(56) References Cited

U.S. PATENT DOCUMENTS

| | | | | |
|---|---|---|---|---|
| 3,737,881 A * | 6/1973 | Cordi | ...................... | G06F 12/08 711/3 |
| 3,806,883 A * | 4/1974 | Weisbecker | .......... | G06F 12/123 711/E12.072 |
| 6,490,665 B1 * | 12/2002 | Lai | ........................ | G06F 12/123 711/E12.072 |
| 6,643,742 B1 * | 11/2003 | Vidwans | ............... | G06F 12/125 711/E12.074 |
| 2002/0194444 A1 * | 12/2002 | Goodrich, II | ....... | G06F 13/1626 711/167 |
| 2006/0004956 A1 * | 1/2006 | Madajczak | ............ | G11C 15/00 711/108 |
| 2006/0248277 A1 * | 11/2006 | Pande | .................... | G06F 12/123 711/E12.072 |
| 2013/0046920 A1 * | 2/2013 | Ryu | ...................... | G06F 3/0649 711/E12.008 |
| 2013/0073798 A1 | 3/2013 | Kang et al. | | |
| 2013/0121075 A1 | 5/2013 | Hutchison et al. | | |
| 2015/0121023 A1 | 4/2015 | Kolvick et al. | | |
| 2017/0010820 A1 * | 1/2017 | Day | ..................... | G06F 9/3851 |
| 2018/0088807 A1 | 3/2018 | Zhao et al. | | |
| 2019/0237150 A1 | 8/2019 | Jeong et al. | | |
| 2019/0370177 A1 * | 12/2019 | Olderdissen | .......... | G06F 12/122 |
| 2021/0064535 A1 * | 3/2021 | Han | ..................... | G06F 11/3471 |
| 2022/0066681 A1 * | 3/2022 | He | ........................ | G06F 3/0604 |

OTHER PUBLICATIONS

International Search Report & Written Opinion dated Jun. 13, 2022 for PCT Appl. No. PCT/US2022/019166.

* cited by examiner

*Primary Examiner* — Ryan Bertram
(74) *Attorney, Agent, or Firm* — Dorsey & Whitney LLP

(57) ABSTRACT

A cold data detector circuit includes a bubble break register that is configured to detect cold data in a memory system including main memory and secondary memory. The bubble break register selectively shifts received segment addresses to fill empty slots without having to wait until the empty slots are shifted out an end slot, and may provide an indication of cold data in response to every slot of the register being filled with a different respective segment address.

20 Claims, 7 Drawing Sheets

COLD DATA DETECTOR IN MEMORY SYSTEM

BACKGROUND OF THE INVENTION

Hybrid memory systems may store frequently-accessed data in lower latency memory, and may move less frequently accessed data (e.g., cold data) in higher latency memory as available storage space within the lower latency memory decreases. However, counters and other circuitry in the lower latency memory to detect cold data may consume additional power and space on the die, which may reduce storage capacity and reduce performance of the low latency memory.

DETAILED DESCRIPTION

Figure 1:
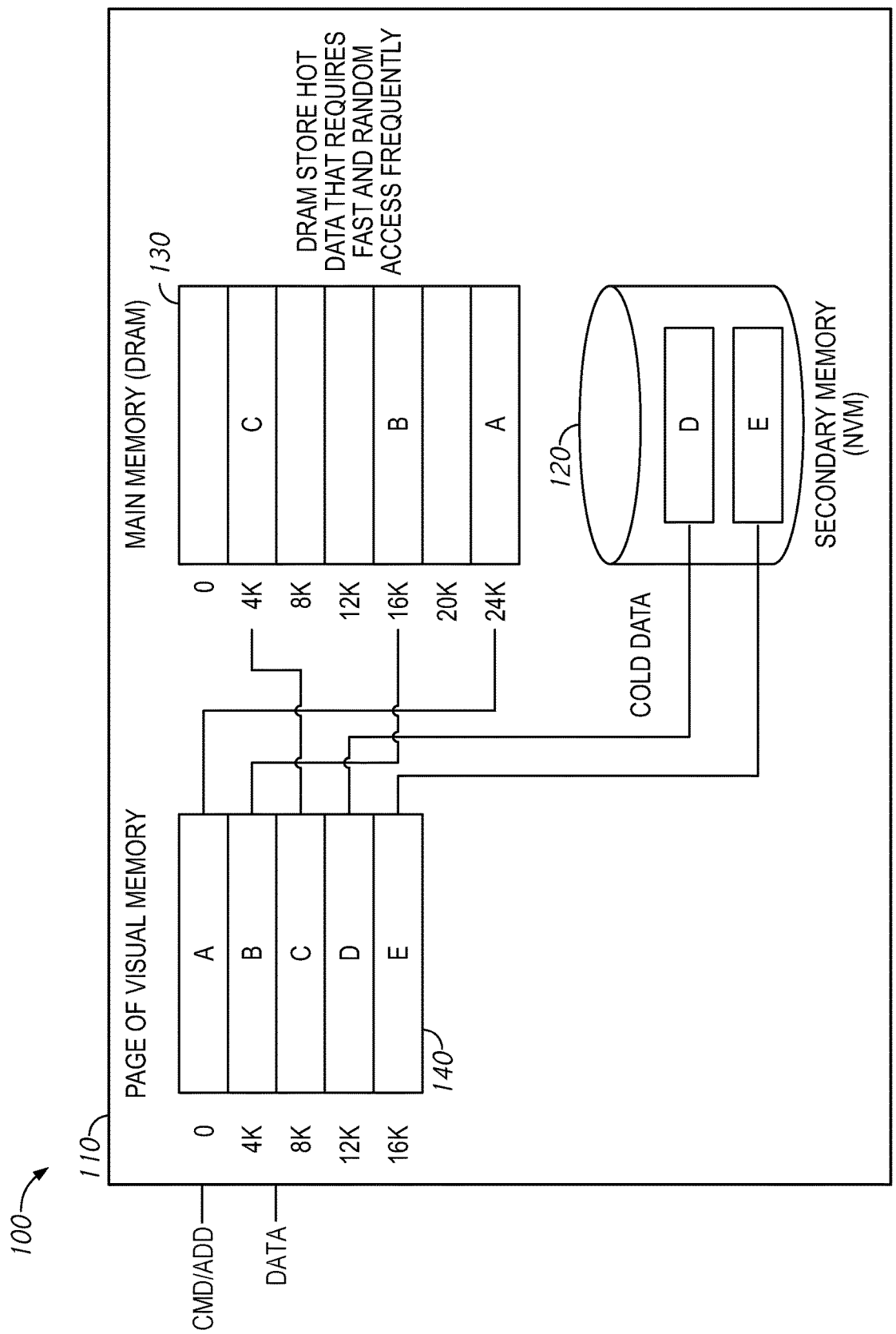
FIG. 1 is a block diagram of a memory system in accordance with an embodiment of the present disclosure.

This disclosure describes examples of a system to detect cold data in a memory system including main memory (e.g., volatile memory, such as dynamic, random-access memory (DRAM)) and secondary memory (e.g., non-volatile memory, such as flash memory). In some memory systems, main memory may be used to initially store data due to its lower latency. As the main memory fills up with data, the main memory may transfer some of the stored data to the secondary memory for longer term storage. The secondary memory may have longer access latency than the main memory. One consideration in transferring data to the secondary memory is selection of the data to transfer. That is, to mitigate efficiency loss by transferring data to the secondary memory, it is desirable to predict which data is most likely to be requested for additional processing (e.g., hot data) and which data is most likely to not experience imminent requests for further processing (e.g., cold data). In one example, hot data may include data that is new and/or frequently-accessed, and cold data may include older, less frequently accessed data. Another consideration in transferring data from the main memory to the secondary memory is determining a point at which the main memory is sufficiently full of data such that more room needs to be made to accommodate future processing.

In some examples to address one or both of these considerations, the cold data detector described herein may include a bubble break register or buffer architecture that is configured to capture and store access information indicating which segments or sections of a main memory are currently storing cold (e.g., older data). By its nature, the bubble break register architecture may be capable of indicating both when a transfer should be initiated, and which segment of the main memory includes cold data.

The bubble break register architecture may include a form of a shift register, but may make complete use of the register by selectively shifting received data to fill empty slots without having to wait until the empty slots are shifted out an end slot. The bubble break register may include a flag circuit that includes a respective flag corresponding to each slot in the register. Each respective flag may be configured to indicate whether a particular slot in the register currently holds a valid segment address or not. Thus, for a particular slot, the respective flag indicates whether a segment address stored in the respective address circuit is valid. When the respective flag for the particular slot indicates that the segment address is not valid (e.g., an empty slot or a bubble in the register), a shift of a new segment address into the register may result in the empty slot being filled by shifting existing segment addresses from preceding slots by one such that a first end slot becomes available to shift in the new segment address, while subsequent slots storing valid segment addresses remain unaffected.

For example, in a register may include four segment address slots, with all slots holding valid segment addresses except the third slot. When a new segment address is received, a segment address from the second slot may shift to fill the empty third slot, a segment address from the first slot may shift to replace the data in the second slot, and the new segment address may shift into the first slot. The fourth slot may remain unaffected by the shift in this example.

In some examples, the bubble break register may be utilized to store a limited subset of segment addresses in a semiconductor device. When a new segment address matching a previously-stored segment address is received, the previously-stored segment address may be invalidated (e.g., by setting or clearing the corresponding flag), and the new segment address may be shifted into the register. Invalidating the previously-stored segment address may cause that previously-stored segment address to be overwritten. In some examples, the size of the bubble break register (e.g., number of slots) may be based on a number of segments in a main memory. Thus, the register may be capable of contemporaneously storing a respective segment address for each segment of the main memory. When every slot of the register is filled, every flag may indicate every slot has a valid segment address.

A control circuit may be coupled to the bubble break register, and may cause the bubble break register to provide cold address data at an output in response to detection of at least one access of every segment in a bank. The control circuit may include a respective latch circuit for each segment in a bank, with each individual latch being set in response to receipt of a corresponding segment address activation.

The cold address data for a bank may be provided to and stored at a cold data readout circuit having a shift register. The shift register may include a slot for each bank of the memory, and in response to each slot being filled, a logic circuit may cause the shift register to initiate a transfer of the contents of data stored in segments of the memory corresponding to segment addresses stored in the shift register to secondary storage. The shift register and/or the bubble break register control circuit may be reset to start detection that the memory is becoming full.

Certain details are set forth below to provide a sufficient understanding of embodiments of the present disclosure.

However, it will be clear to one skilled in the art that embodiments of the present disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

FIG. 1 is a block diagram of a memory system 100 in accordance with an embodiment of the present disclosure. The memory system 100 may include a memory module 110 having a secondary memory 120 and primary memory 130, as well as a module controller 140 configured to maintain pages of visual memory to manage data storage locations between the secondary memory 120 and the primary memory 130 in order to route access requests to the correct memory. In some examples, the primary memory 130 may include volatile memory and the secondary memory 120 may include non-volatile memory. The memory system 100 may be included in a device, a memory module, a system-on-a-chip (SOC), or any other type of architecture configured to implement the memory system.

The memory system 100 may be configured to receive commands CMD, addresses ADD, and data from a host or memory controller (not shown) to perform access operations (e.g., reading, writing, etc.) for maintaining data on the memory system 100. The secondary memory 120 may include flash memory or another type of WM, and the primary memory 130 may include any type of DRAM, including double data rate (DDR) 3, DDR4, DDR5, low power DDR, graphics DDR, etc.

In some examples, when operating in a computing system, the primary memory 130 may be configured as a main memory configured to temporarily store data generated and consumed during processing tasks, and the secondary memory 120 may be configured as a secondary memory to provide supplemental and/or permanent storage should the primary memory 130 become full of stored data or fail. In this example, the primary memory 130 may be used to initially store data due to its lower access latency as compared with the secondary memory 120, and as the primary memory 130 fills up with data, the primary memory 130 may transfer some of the stored data to the secondary memory 120 for longer term storage, either directly or via the module controller 140.

The primary memory 130 may include a cold data detector and readout circuit that is configured to trigger a transfer of data to the secondary memory 120 based on a determination that the primary memory 130 is sufficiently full such that more space should be made available. At least two considerations for transferring data to the secondary memory 120 may include determining when to transfer the data and determining which data to transfer. In some examples, the cold data detector and readout circuit may also designate which data to transfer to the secondary memory 120. Selecting which data to transfer may including identifying which data are likely to be accessed for further processing and which data are unlikely to be accessed for further processing. That is, to mitigate efficiency loss caused by the increased access latency of the secondary memory 120, it may be desirable to predict Which data are hot data (e.g., data most likely to be requested for additional processing and which data are cold data (e.g., most likely to not experience imminent requests for further processing). In one example, hot data may be data that is new and/or frequently-accessed within the primary memory 130, and cold data may include older, less frequently accessed data.

The determination as to when to transfer the data from the primary memory 130 to the secondary memory 120 may be based on a determination by the cold data detector and readout circuit as to when the primary memory 130 is sufficiently full (e.g., has reached a threshold) of stored data such that more memory space needs to be made to accommodate future data storage.

In some examples to address one or both of these considerations, the cold data detector and readout circuit may include a bubble break register or buffer architecture that is configured to capture and store access information indicating which segments or sections of a bank of a main memory are currently storing cold (e.g., older data). By its nature, the bubble break register architecture may be capable of indicating which segment of the main memory includes cold data in response to a determination by a control circuit that each segment of a bank has been accessed at least one time.

The bubble break register of the cold data detector circuit may include a form of a shift register, hut may make complete use of the register by selectively shifting received data to fill empty slots without having to wait until the empty slots are shifted out an end slot. The bubble break register may include a flag circuit that includes a respective flag corresponding to each slot in the register. Each respective flag may be configured to indicate whether a particular slot in the register currently holds a valid segment address or not. Thus, for a particular slot, the respective flag indicates whether a segment address stored in the respective address circuit is valid. When the respective flag for the particular slot indicates that the segment address is not valid (e.g., an empty slot or a bubble in the register), a shift of a new segment address into the register may result in the empty slot being filled by shifting existing segment addresses from preceding slots by one such that a first end slot becomes available to shift in the new segment address, while subsequent slots storing valid segment addresses remain unaffected.

For example, in a register may include four segment address slots, with all slots holding valid segment addresses except the third slot. When a new segment address is received, a segment address from the second slot may shift to fill the empty third slot, a segment address from the first slot may shift to replace the data in the second slot, and the new segment address may shift into the first slot. The fourth slot may remain unaffected by the shift in this example.

In some examples, the bubble break register of the cold data detector circuit may be utilized to store a limited subset of segment addresses for a bank of the memory array a semiconductor device. When a new segment address matching a previously-stored segment address is received, the previously-stored segment address may be invalidated (e.g., by setting or clearing the corresponding flag), and the new segment address may be shifted into the register. Invalidating the previously-stored segment address may cause that previously-stored segment address to be overwritten. In some examples, the size of the bubble break register (e.g., number of slots) may be based on a number of segments in a main memory.

When every slot of the register is filled, every flag may indicate every slot has a valid segment address. The control circuit may to the bubble break register may cause the bubble break register to provide cold address data at an output in response to detection of at least one access of every segment in a bank. The control circuit may include a respective latch circuit for each segment in a bank, a logic gate to detect when each latch is set, and a pulse generator to cause the bubble break register to provide a cold address from the bubble break register. Each individual latch may be set in response to receipt of a corresponding segment address activation. In some examples, the coldest data may be determined based on the segment address stored in the last slot of the bubble break register.

The cold address data output from the bubble break register for a bank may be provided to and stored at a shift register of the cold data detector and readout circuit. The shift register may include a slot for each bank of the primary memory 130, and in response to each slot being filled, a logic circuit of the cold data detector and readout circuit may cause the shift register to initiate a transfer of the contents of data stored in segments of the primary memory 130 corresponding to segment addresses stored in the shift register to the secondary memory 120. The shift register and/or the bubble break register control circuit may be reset to start detection that the memory is becoming full.

Using the bubble break register architecture in the cold data detector circuit of the primary memory 130 to determine when to trigger a transfer of data from the primary memory 130 to the secondary memory 120, as well as to determine Which data to transfer, my provide a more efficient mechanism to manage storage at the primary memory 130 as compared with counters and other conventional circuitry implemented for this purpose.

Figure 2:
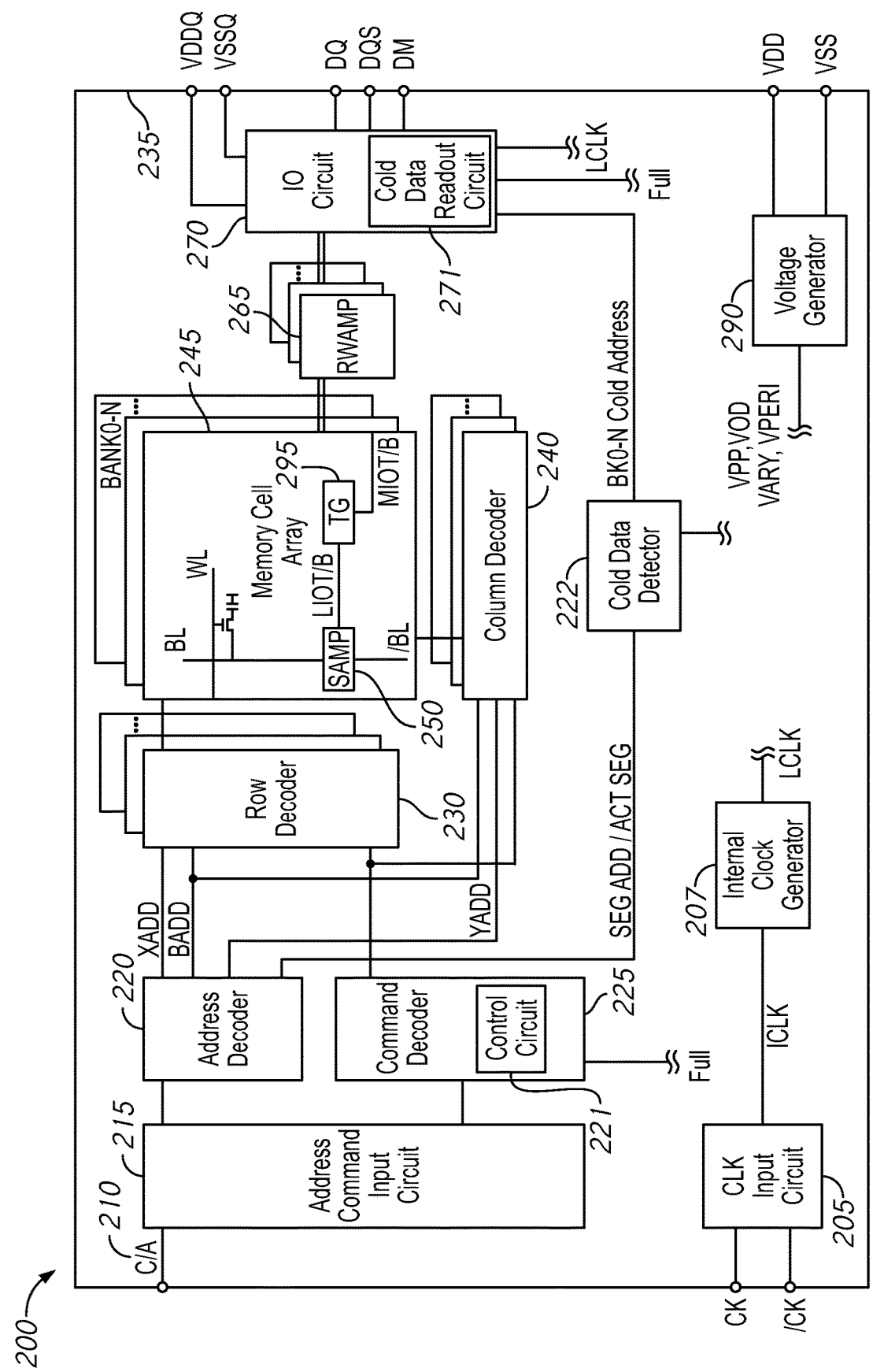
FIG. 2 is a schematic block diagram of a semiconductor device memory system, in accordance with an embodiment of the present disclosure.

FIG. 2 is a schematic block diagram of a semiconductor device 200, in accordance with an embodiment of the present disclosure. For example, the semiconductor device 200 may include a chip 235. The chip 235 may include a clock input circuit 205, an internal clock generator 207, an address command input circuit 215, an address decoder 220, a command decoder 225, a control circuit 221, a cold data detector circuit 222, a plurality of row decoders 230, a memory cell array 245 including sense amplifiers 250 and transfer gates 295, a plurality of column decoders 240, a plurality of read/write amplifiers 265, an input/output (I/O) circuit 270, a cold data readout circuit 271, and a voltage generator 290. The semiconductor device 200 may include a plurality of external terminals including address and command terminals coupled to command/address bus 210, clock terminals CK and /CK, data terminals DQ, DQS, and DM, and power supply terminals VDD, VSS, VDDQ, and VSSQ. The chip 235 may be mounted on a substrate, for example, a memory module substrate, a mother board or the like.

The memory cell array 245 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. Each of the banks BANK0-N may divided into two or more memory planes (e.g., column planes), which may be selected by the column select CS signal from the column decoders 240. In some examples, each of the banks BANK0-N may include 2, 4, 8, 16, 32, etc., column planes. The selection of the word line WL for each bank is performed by a corresponding row decoder 230 and the selection of the bit line BL is performed by a corresponding column decoder 240. The plurality of sense amplifiers 250 are located for their corresponding bit lines BL and coupled to at least one respective local I/O line further coupled to a respective one of at least two main I/O line pairs, via transfer gates TG 295, which function as switches.

The address/command input circuit 215 may receive an address signal and a bank address signal from outside at the command/address terminals via the command/address bus 210 and transmit the address signal and the bank address signal to the address decoder 220. The address decoder 220 may decode the address signal received from the address/command input circuit 215 and provide a row address signal XADD to the row decoder 230, and a column address signal YADD to the column decoder 240. The address decoder 220 may also receive the bank address signal and provide the bank address signal BAD to the row decoder 230 and the column decoder 240.

The address/command input circuit 215 may receive a command signal from outside, such as, for example, a memory controller 205 at the command/address terminals via the command/address bus 210 and provide the command signal to the command decoder 225. The command decoder 225 may decode the command signal and provide generate various internal command signals. For example, the internal command signals may include a row command signal to select a word line, a column command signal, such as a read command or a write command, to select a bit line, anchor a low latency enable bit to enable use of the control circuit control circuit 221 and/or the low latency register cold data detector circuit 222.

When a read command is issued and a row address and a column address are timely supplied with the activation and read commands (ACT/RW), read data is read from a memory cell in the memory cell array 245 designated by the row address and the column address. The read/write amplifiers 265 may receive the read data DQ and provide the read data DQ to the IO circuit 270, The IO circuit 270 may provide the read data DQ to outside via the data terminals DQ, together with a data strobe signal at DQS and/or a data mask signal at DM. Similarly, when the write command is issued and a row address and a column address are timely supplied with the ACT and write commands R/W, and then the input/output circuit 270 may receive write data at the data terminals DQ, together with a data strobe signal at DQS and/or a data mask signal at and provide the write data via the read/write amplifiers 265 to the memory cell array 245. Thus, the write data may be written in the memory cell designated by the row address and the column address.

In some examples, when operating in a computing system, the semiconductor device 200 may be configured as a main memory configured to temporarily store data generated and consumed during processing tasks. The semiconductor device 200 may be capable of transferring data to a secondary memory (not shown) (e.g., the secondary memory 120 of FIG. 1), which may be configured to provide secondary and/or permanent storage should the semiconductor device 200 become full of stored data or fail. In this example, the semiconductor device 200 may be used to initially store data due to its lower access latency as compared with a secondary memory, and as the semiconductor device 200 fills up with data, the semiconductor device 200 may transfer some of the stored data to the secondary memory for longer term storage.

The control circuit 221, the cold data detector circuit 222, and the cold data readout circuit 271 may be configured to trigger a transfer of data to the secondary memory based on a determination that the memory cell array 245 is sufficiently full such that more space should be made available. At least two considerations for transferring data to the secondary memory may include determining when to transfer the data and determining which data to transfer. In some examples, the control circuit 221 and the cold data detector circuit 222 may also designate which data to transfer to the secondary memory. Selecting which data to transfer may including identifying which data are likely to be accessed for further processing and which data are unlikely to be accessed for further processing. That is, to mitigate efficiency loss caused by the increased access latency of the secondary memory, it may be desirable to predict which data are hot data and which data are cold data. In one example, hot data may be data that is new and/or frequently-accessed within the memory cell array 245, and cold data may include older, less frequently accessed data.

The determination as to when to transfer the data from the semiconductor device 200 to the secondary memory may be based on a determination by the control circuit 221 and the cold data detector circuit 222 as to when the memory cell array 245 is sufficiently full (e.g., has reached a threshold) of stored data such that more memory space needs to be made to accommodate future data storage.

In some examples to address one or both of these considerations, the cold data detector circuit 222 may include a bubble break register or buffer architecture that is configured to capture and store access information indicating which segments or sections of a particular bank of the memory banks BANK0-N of the memory cell array 245 are currently storing cold (e.g., older data). In some examples, the cold data detector circuit 222 may be configured to determine when a segment address of the corresponding bank of the memory banks BANK0-N of should be provided to the cold data readout circuit 271, as well as which segment address of the corresponding bank of the memory banks BANK0-N of the memory cell array 245 includes cold data.

The bubble break register of the cold data detector circuit 222 may include a form of a shift register, but may make complete use of the register by selectively shifting received data to fill empty slots without having to wait until the empty slots are shifted out an end slot. The cold data detector circuit 222 may be configured to receive a segment address SEG ADD and the LCLK signal, and may be configured to shift the SEG ADD into the bubble break register in response to the LCLK signal. In response to each of the slots of the bubble break register being filled with a valid SEG ADD, the cold data detector circuit 222 may set a cold data signal COLD DATA to indicate that the bubble break register is full. In response to the COLD DATA signal, the control circuit 221 may initiate a transfer of data from the memory cell array 245 to the secondary memory. In some examples, during an access operation, the control circuit 221 may also set a mode register segment parameter to indicate which particular segment has been accessed based on the SEG ADD provided to the cold data detector circuit 222. In some examples, the COLD DATA signal may also indicate a segment address indicating a segment from which the data should be transferred. The segment address may be a segment address stored at a last slot of the bubble break register (e.g., slot with the oldest data).

The bubble break register of the cold data detector circuit 222 may include a flag circuit that includes a respective flag corresponding to each slot in the register. Each respective flag may be configured to indicate whether a particular slot in the register currently holds a valid segment address or not. Thus, for a particular slot, the respective flag indicates whether a segment address stored in the respective address circuit is valid. When the respective flag for the particular slot indicates that the segment address is not valid (e.g., an empty slot or a bubble in the register), a shift of a new segment address into the register may result in the empty slot being filled by shifting existing segment addresses from preceding slots by one such that a first end slot becomes available to shift in the new segment address, while subsequent slots storing valid segment addresses remain unaffected.

For example, in an implementation where the bubble break register of the cold data detector circuit 222 includes four segment address slots, with all slots holding valid segment addresses except the third slot. When a new segment address SEG ADD is received, a segment address from the second slot may shift to fill the empty third slot, a segment address from the first slot may shift to replace the data in the second slot, and the new segment address may shift into the first slot. The fourth slot may remain unaffected by the shift in this example.

In some examples, each of the memory banks BANK0-N of the semiconductor device 200 may be divided into multiple segments. As such, in some examples, the cold data detector circuit 222 may include a bubble break register for each of the memory banks BANK0-N, and the cold data detector circuit 222. In an example with a bubble break register for each memory bank BANK0-N, the segment address may indicate a particular memory bank (e.g., may include the bank address BADD) targeted during the read or write access. In one example, the cold data detector circuit 222 may be configured to provide the cold data segment address to the cold data readout circuit 271 in response to access of each segment of within a particular memory bank BANK0-N.

In some examples, the bubble break register of the cold data detector circuit 222 may be utilized to store a limited subset of segment addresses for a particular memory bank BANK0-N in of the semiconductor device 200. When a new segment address matching a previously-stored segment address is received, the previously-stored segment address may be invalidated (e.g., by setting or clearing the corresponding flag), and the new segment address may be shifted into the register. Invalidating the previously-stored segment address may cause that previously-stored segment address to be overwritten. In some examples, the size of the bubble break register (e.g., number of slots) may be based on a number of segments in a main memory. Thus, the register may be capable of contemporaneously storing a respective segment address for each segment of the memory cell array 245.

When every slot of the register is filled, every flag may indicate every slot has a valid segment address. The control circuit may cause the bubble break register may cause the bubble break register to provide cold address at an output in response to detection of at least one access of every segment in a bank. The control circuit may include a respective latch circuit for each segment in a bank, a logic gate to detect when each latch is set, and a pulse generator to cause the bubble break register to provide a cold address from the bubble break register. Each individual latch may be set in response to receipt of a corresponding segment address activation. A determination as to which segment to transfer data from may be based on which segment address has the oldest (e.g., coldest) data. In some examples, the coldest data may be determined based on the segment address stored in the last slot of the register.

The BK0-N cold address output from the bubble break register of the cold data detector circuit 222 for a memory bank BANK0-N may be provided to and stored at a shift register of the cold data readout circuit 271. The shift register may include a slot for each bank of the memory banks BANK0-N of the memory cell array 245, and in response to each slot being filled, the shift register may provide a Full signal. In response to the Full signal, the control circuit 221 may cause the cold data readout circuit 271 to provide the data from segments of the memory cell array 245 corresponding to the segment addresses stored at the shift register to the output data terminals DQ. In response to the cold data being read out of the memory cell array 245, the cold data detector circuit 222 and the cold data readout circuit 271 may be reset to start detection that the memory cell array is becoming full.

Using the bubble break register architecture in the cold data detector circuit 222 to assist in determining when to trigger a transfer of data from the semiconductor device 200, as well as to assist in determining which data to transfer, my provide a more efficient mechanism to manage storage at the semiconductor device 200 as compared with counters and other conventional circuitry implemented for this purpose.

Turning to the explanation of the external terminals included in the semiconductor device 200, the clock terminals CK and /CK may receive an external clock signal and a complementary external clock signal, respectively. The external clock signals (including complementary external clock signal) may be supplied to a clock input circuit 205. The clock input circuit 205 may receive the external clock signals and generate an internal clock signal ICLK. The clock input circuit 205 may provide the internal clock signal ICLK to an internal clock generator 207. The internal clock generator 207 may generate a phase controlled internal clock signal LCLK based on the received internal clock signal ICLK and a clock enable signal CKE from the address/command input circuit 215. Although not limited thereto, a DLL circuit may be used as the internal clock generator 207. The internal clock generator 207 may provide the phase controlled internal clock signal LCLK to the IO circuit 270. The IO circuit 270 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 290. The voltage generator circuit 290 may generate various internal voltages, VPP, VOD, VARY, VPERI, and the like based on the power supply voltages VDD and VSS. The internal voltage VPP is mainly used in the row decoder 230, the internal voltages VOD and VARY are mainly used in the sense amplifiers 250 included in the memory cell array 245, and the internal voltage VPERI is used in many other circuit blocks. The power supply terminals may also receive power supply voltages VDDQ and VSSQ. The IO circuit 270 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 270.

Figure 3:
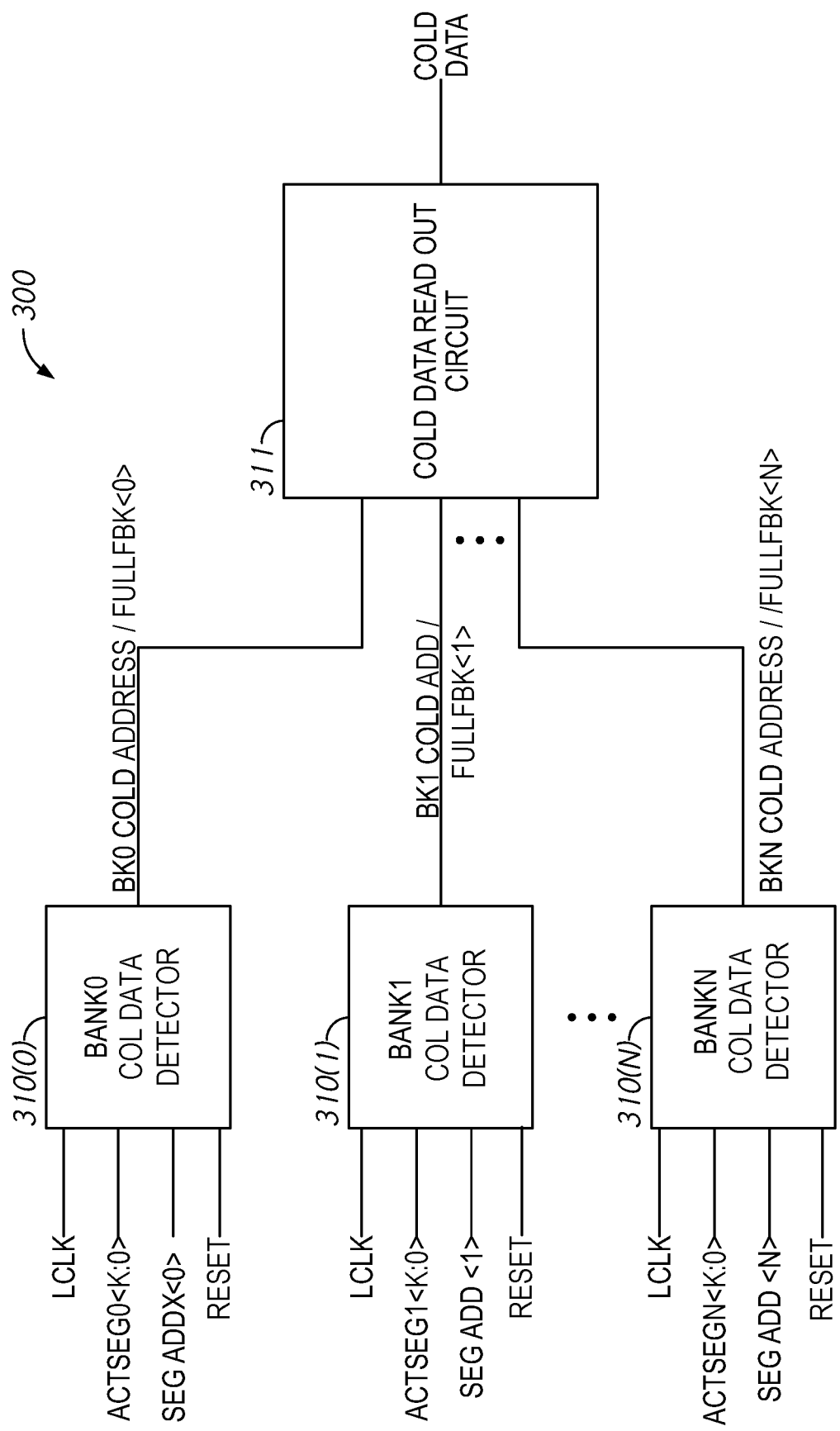
FIG. 3 is a block diagram of a logic circuit of a, in accordance with an embodiment of the present disclosure.

FIG. 3 is a block diagram of a cold data detection circuit of a 300, in accordance with an embodiment of the present disclosure. The cold data detection circuit 300 includes BANK0-N cold data detectors 310(0)-(N) coupled to a cold data readout circuit 311. In some examples, the cold data detector circuit of the primary memory 130 of FIG. 1 and/or the cold data detector circuit 222 of FIG. 2 may implement the BANK0-N cold data detectors 310(0)-(N) and the cold data readout circuit 271 of FIG. 2 may implement the cold data readout circuit 311.

Each of the BANK0-N cold data detectors 310(0)-(N) may include a control circuit configured to receive a respective segment activation signal ACTSEG0-N<K:0> and a RESET signal, and a bubble break register configured to receive a clock signal LCLK and a segment address SEG ADD <X>. The ACTSEG0-N<K:0> signal and the SEG ADD<N:0> may indicate segment of the corresponding bank is being accessed.

The bubble break register of each of the BANK0-N cold data detectors 310(0)-(N) may include a form of a shift register, but may make complete use of the register by selectively shifting received data to fill empty slots without having to wait until the empty slots are shifted out an end slot.

The control circuit of a particular one of the BANK0-N cold data detectors 310(0)-(N) may cause the corresponding bubble break register to provide the BK0-N cold address and a respective full bank signal FULLBKF <N:0> at an output in response to detection of at least one access of every segment in a memory bank. The control circuit may include a respective latch circuit for each segment in a bank, a logic gate to detect when each latch is set, and a pulse generator to cause the bubble break register to provide a cold address from the bubble break register. Each individual latch may be set in response to receipt of a corresponding segment address activation via the corresponding ACTSEG0-N<K:0> signal. In response to each of the latches being set, the control circuit may trigger provision of the respective BK0-N cold address and a bank full signal FULLBKF<N:0> signal to the cold data readout circuit 311, cold data readout circuit 311 cold data readout circuit 311

The bubble break register of each of the BANK0-N cold data detectors 310(0)-(N) may include a flag circuit that includes a respective flag corresponding to each slot in the register. Each respective flag may be configured to indicate whether a particular slot in the register currently holds a valid segment address or not. Thus, for a particular slot, the respective flag indicates whether a segment address stored in the respective address circuit is valid. When the respective flag for the particular slot indicates that the segment address is not valid (e.g., an empty slot or a bubble in the register), a shift of a new segment address into the register may result in the empty slot being filled by shifting existing segment addresses from preceding slots by one such that a first end slot becomes available to shift in the new segment address, while subsequent slots storing valid segment addresses remain unaffected.

For example, in an implementation where the bubble break register of each of the BANK0-N cold data detectors 310(0)-(N) includes four segment address slots, with all slots holding valid segment addresses except the third slot. When a new segment address SEG ADD is received, a segment address from the second slot may shift to fill the empty third slot, a segment address from the first slot may shift to replace the data in the second slot, and the new segment address may shift into the first slot. The fourth slot may remain unaffected by the shift in this example.

When the control circuit for one of the BANK0-N cold data detectors 310(0)-(N) detects that each segment has been accessed at least one time, the control circuit may cause the bubble break register to shift segment addresses to an output of a last slot of the bubble break register until valid a valid segment address has been provided as the BK0-N cold address.

The BK0-N cold address output from the bubble break register of the BANK0-N cold data detectors 310(0)-(N) may be provided to and stored at a shift register of the cold data readout circuit 311. The shift register may include a slot for each bank of the N memory banks of the memory cell array, and in response to each of the FULLNKF<N:0> signals indicating that the respective memory bank BANK0-N is full, the shift register may generate a Full signal. In response to the Full signal, the cold data readout circuit cold data readout circuit 311 to provide the data corresponding to the BK0-N cold addresses received from the cold data detectors 310(0)-(N). In response to the cold data being read out of the memory cell array, the reset signals received at the cold data detectors 310(0)-(N) may be set to cause the cold data detectors 310(0)-(N) to reset and start detecting whether a respective memory bank is full.

In operation, the bubble break register of each of the BANK0-N cold data detectors 310(0)-(N) may be utilized to store a limited subset of segment addresses for a memory bank of a memory cell array of a semiconductor device. When a new segment address matching a previously-stored segment address is received, the previously-stored segment address may be invalidated (e.g., by setting or clearing the corresponding flag), and the new segment address may be shifted into the register. Invalidating the previously-stored segment address may cause that previously-stored segment address to be overwritten. In some examples, the size of the bubble break register (e.g., number of slots) may be based on a number of segments in a main memory. Thus, the register may be capable of contemporaneously storing a respective segment address for each segment of the main memory. When every slot of the bubble break register of one of the BANK0-N cold data detectors 310(0)-(N) filled, every flag may indicate every slot has a valid segment address.

When the control circuit for one of the BANK0-N cold data detectors 310(0)-(N) detects that each segment has been accessed at least one time, the control circuit may cause the bubble break register to shift segment addresses to an output of a last slot of the bubble break register until valid a valid segment address has been provided as the BK0-N cold address. In some examples, the coldest data may be determined based on the segment address stored in the last slot of the bubble break register.

When the cold data readout circuit 311 has received a BK0-N cold address and the FULLBKF<N:0> signal from each of the BANK0-N cold data detectors 310(0)-(N), the cold data readout circuit 311 may provide an indication that the memory is full, and may initiate a transfer of data from memory bank segments corresponding to the BK0-N cold addresses stored in the shift register. In response to the data being transferred out of the memory array, the reset signals received at the cold data detectors 310(0)-(N) may be set to cause the cold data detectors 310(0)-(N) to reset and start detecting whether the respective memory bank is full.

Using the bubble break register architecture in the BANK0-N cold data detectors 310(0)-(N) to determine when to trigger a transfer of data from the corresponding memory cell array, as well as to determine which data to transfer, may provide a more efficient mechanism to manage storage at the memory cell array as compared with counters and other conventional circuitry implemented for this purpose.

Figure 4:
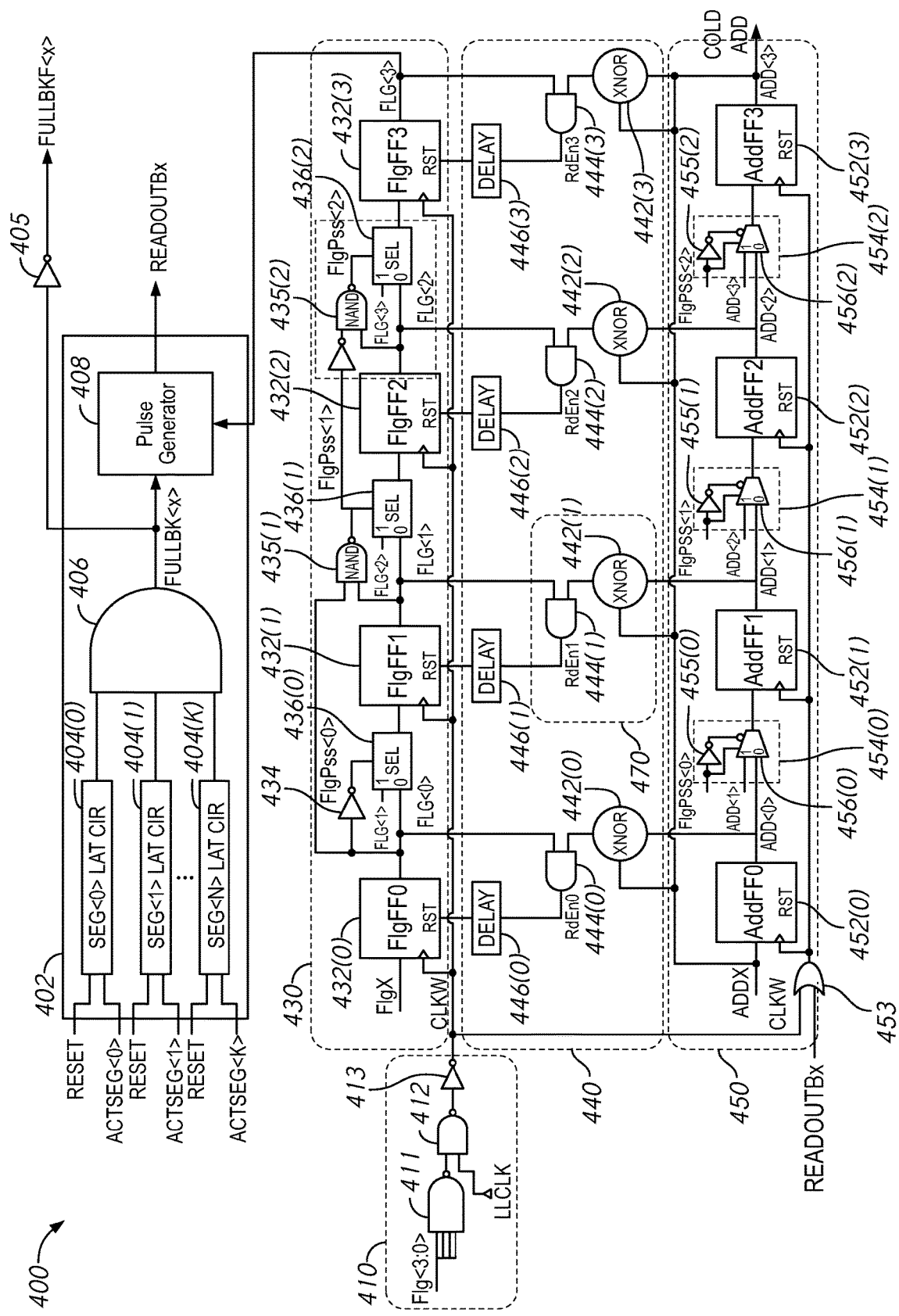
FIG. 4 is a schematic block diagram of a bubble break register circuit of a semiconductor device, in accordance with an embodiment of the present disclosure.

FIG. 4 is a schematic block diagram of a cold data detector 400 of a semiconductor device, in accordance with an embodiment of the present disclosure. The cold data detector 400 includes a control circuit 402 and a bubble break register having an input circuit 410; a flag path circuit 430, an address match logic circuit 440, and an address path circuit 450. Any of the cold data detector circuit 132 of FIG. 1, the cold data detector circuit 222 of FIG. 2, and/or any of the BANK0-N cold data detectors 310(0)-(N) of FIG. 3 may implement the cold data detector 400, in some examples.

The control circuit 402 may include a set of latch circuits 404(0)-(K) each corresponding to a segment of K+1 segments of a memory bank, an AND gate 406, an inverter 405, and a pulse generator 408. The latch circuits 404(0)-(K) may each be configured to receive a respective segment activation signal ACTSEG<K:0> and a reset signal. The output of each of the latch circuits 404(0)-(K) may be provided to the AND gate 406. Each individual latch may be set in response to receipt of a corresponding segment address activation via the corresponding ACTSEG0-N<K:0> signal. In response to each of the latch circuits 404(0)-(K) being set, the AND gate 406 may provide a full signal FULLBK<x> to the pulse generator 408 and to the inverter 405, which provides the FULLBKF<x> signal to an output, to initiate output of a cold address from the address path circuit 450 in response to the READOUTBx clock signal provided to an 453. The pulse generator 408 may use the FLG<3> signal to determine when a valid cold address has been output from the address path circuit 450. That is, if the bubble break register isn't full, the first valid data may be stored in an address flip-flop other than the address flip-flop 3 452(3). As such, the pulse generator 408 may pulse the READOUTBx clock signal until a valid cold address is output from the address flip-flop 3 452(3), and may stop providing pulses on the READOUTBx clock signal after the cold address is output. The RESET signal may cause the latch circuits 404(0)-(K) to reset after data has been transferred out of a memory array. In response to each of the latch circuits 404(0)-(K) being set, the AND gate 406 may also provide the FULLBK<x> to the inverter 405, which inverts the FULLBK<x> signal to provide the FULLBKF<x> signal at an output.

The input circuit 410 may include a NAND gate 411 coupled to an AND gate formed by a NAND gate 412 and an inverter 413. The NAND gate 411 is configured to receive flag bits FLG<3:0> from the flag path circuit 430 that each indicate whether a particular slot of the low latency register 400 holds valid data and is configured to apply NAND logic to provide an output to the NAND gate 412 (e.g., when all of the FLG<3:0> bits are set, the output of the NAND gate 411 is set to a low logical value; otherwise it is set to a high logical value). In addition to the output of the NAND gate 411, the NAND gate 412 is configured to receive a clock signal CLK. Based on the output of the NAND gate 411 and the CLK signal, the NAND gate 412 is configured to provide an output to the inverter 413, which inverts the output to provide a write clock signal CLKW to the 430 and the address path circuit 450.

The flag path circuit 430 includes a set of flag flip-flops 432(0)-(3) and the address path circuit 450 includes a respective set of address flip-flops 452(0)-(3). In addition to the set of flag flip-flops 432(0)-(3), the flag path circuit 430 further includes an inverter 434, a set of NAND gates 435(1)-(2), and a set of selector circuits SEL 436(0)-(2). Each of the set of flag flip-flops 432(1)-(3) is configured to receive one of an output of a preceding one of the set of flag flip-flops 432(0)-(2) or an output of that respective flag flip-flop 432(1)-(3) via selector circuits SEL 436(0)-(2), with the flag flip-flop 432(0) configured to receive an active high flag signal FLGX, and may provide the respective FLG<3:0> signal at an output. Each of the flag flip-flops 432(0)-(3) may transition a respective input signal to the respective FLG<3:0> signal at an output in response to the CLKW signal.

The inverter 434 may be configured to receive the FLG<0> signal and may be configured to invert the FLG<0> signal to provide the FLGPSS<0> signal to the selector circuit SEL 436(0). The selector circuit SEL 436(0) may be configured to selectively provide the FLG<0> signal (e.g., when the FLGPSS<0> signal has a first value) or the FLG<1> signal to an input of the flag flip-flop 432(1) (e.g., when the FLGPSS<0> signal has a second value) based on a value of the FLGPSS<0> signal.

The NAND gate 435(1) may be configured to receive the FLG<1> signal and the FLG<0>signal, and may be configured to apply NAND logic based on the FLG<1> signal and the FLG<0> signal to provide the FLGPSS<1> signal to the selector circuit SEL 436(1) and to the NAND gate 435(2). The selector circuit SEL 436(1) may be configured to selectively provide the FLG<1>signal (e.g., when the FLGPSS<1> signal has a first value) or the FLG<2> signal (e.g., when the FLGPSS<1> signal has a second value) to an input of the flag flip-flop 432(2) based on a value of the FLGPSS<1> signal.

The NAND gate 435(2) may be configured to receive an active low (via an inverter) FLGPSS<1> signal and the FLG<2> signal, and may be configured to apply NAND logic based on the active low FLGPSS<1> signal and the FLG<2> signal to provide the FLGPSS<2> signal to the selector circuit SEL 436(2). The selector circuit SEL 436(2) may be configured to selectively provide the FLG<2> signal (e.g., when the FLGPSS<2> signal has a first value) or the FLG<3> signal (e.g., when the FLGPSS<2> signal has a second value) to an input of the flag flip-flop 432(3) based on a value of the FLGPSS<2> signal.

The address match logic circuit 440 of the cold data detector 400 includes a set of XNOR gate 442(0)-(3), a set of AND gates 444(0)-(3), and a set of delay circuits 446(0)-(4). Each of the set of XNOR gate 442(0)-(3) is configured to compare (e.g., using exclusive NOR logic) a received address bit ADDX with an output address bit ADD<3:0> from a respective one of the set of address flip-flops 452(0)-(3) and provide a result of the comparison to a respective one of the AND gates 444(0)-(3). Each of the set of AND gates 444(0)-(3) is configured to apply AND logic to compare the output of the respective one of the XNOR gate 442(0)-(3) with a respective FLG<3:0> signal to provide a respective read enable signal RDEN0-RDEN3. Thus, the RDEN0-RDEN3 signals each indicate that the corresponding ADD<3:0> bit is valid and it matches the received ADDX bit. Each of the RDEN0-RDEN3 signals may be passed through a respective one of the delay circuits 446(0)-(3) to reset a respective one of the set of flag flip-flops 432(0)-(3).

The first address flip-flop 452(0) may be configured to receive a new address ADDX. In addition to the set of address flip-flops 452(0)-(3), the address path circuit 450 further includes a set of selector circuits 454(0)-(2). Each of the selector circuits 454(0)-(2) may be configured to selectively provide a respective ADD<2:0> address from an output of the address flip-flops 452(0)-(2) or a respective address ADD<3:1> from an output of the address flip-flops 452(1)-(3) to an input of a respective one of the address flip-flops 452(1)-(3) in response to the respective FLGPSS<3:0> signal. The selector circuit SEL 452(0) may be configured to selectively provide the ADD<0> signal (e.g., when the FLGPSS<0> signal has a first value) or the ADD<1> signal to an input of the address flip-flop 452(1) (e.g., when the FLGPSS<0> signal has a second value) based on a value of the FLGPSS<0> signal. The selector circuit SEL 452(1) may be configured to selectively provide the ADD<1> signal (e.g., when the FLGPSS<1> signal has a first value) or the ADD<2> signal to an input of the address flip-flop 452(2) (e.g., when the FLGPSS<1> signal has a second value) based on a value of the FLGPSS<1> signal. The selector circuit SEL 452(2) may be configured to selectively provide the ADD <2> signal (e.g., when the FLGPSS<2> signal has a first value) or the ADD<3> signal to an input of the address flip-flop 452(3) (e.g., when the FLGPSS<2> signal has a second value) based on a value of the FLGPSS<2> signal. The selector circuits SEL 452(0)-(2) may each be configured to receive the respective FLGPSS<2:0> signal, as well as a respective active low FLGPSS<2:0> signal via a respective inverter 455(0)-(2).

Each address flip-flop 452(0)-(3) may provide the respective ADD<3:0> address at an output based on a received input address. Each of the address flip-flops 452(0)-(3) may transition a respective input signal to the respective ADD<3:0> signal at an output in response to the CLKW signal or the READOUTBx clock signal (e.g., to send a cold address responsive to the bank being full).

During a write operation. The FLG<3:0> signals indicates whether or not the respective ADD<3:0> addresses are valid. Thus, the NAND gates 435(0)-(2) and the selector circuits SEL 436(0)-(2) control whether the FLG<2:0> provided from an output of a preceding one of the flag flip-flops 432(0)-(2) is provided to an input of a subsequent one of the flag flip-flops 432(1)-(3) based on values of the FLG<3:0> signals. In addition, the selection circuits SEL 454(0)-(2) control whether the ADD<2:0> bit provided from an output of a preceding one of the address flip-flops 452(0)-(2) or an address bit output from that instant one of the address flip-flops 452(0)-(2) is provided to an input of the instant one of the address flip-flops 452(1)-(3). For example, the inverter 434 receives the FLG<0> signal and the selector circuit 436(0) receives the FLG<0> and FLG<1> signals.

If the FLG<0> signal indicates that the ADD<0> bits are valid, then the inverter 434 may enable the selector circuit 436(0) and the selector circuit 454(0), respectively, to provide the FLG<0> signal and the ADD<0> bit, respectively, to an input of the flag flip-flop 432(1) and the address flip-flop 452(1), respectively. In this scenario, the flag signals and the addresses are passed to the right, because all addresses are valid. Otherwise, the and the ADD<1> signals output from the flag flip-flop 432(1) and the address flip-flop 452(1) are fed back to their respective inputs.

If the FLG<1:0> signals indicate that the ADD<1:0> addresses are valid, then the NAND gate 435(1) may enable the selector circuit 436(1) and the selector circuit 454(1), respectively, to provide the FLG<1> signal and the ADD<1> bit, respectively, to an input of the flag flip-flop 432(2) and the address flip-flop 452(2), respectively. In this scenario, the flag signals and the addresses are passed to the right, because all addresses are valid. Otherwise, the FLG<2> and the ADD<2> signals output from the flag flip-flop 432(2) and the address flip-flop 452(2) are fed back to their respective inputs.

If the FLG<2:1> signals indicate that the ADD<2:1> addresses are valid, then the NAND gate 435(2) may enable the selector circuit 436(2) and the selector circuit 454(2), respectively, to provide the FLG<2> signal and the ADD<2> bit, respectively, to an input of the flag flip-flop 432(3) and the address flip-flop 452(3), respectively. In this scenario, the flag signals and the addresses are passed to the right, because all addresses are valid. Otherwise, the FLG<3> and the ADD<3> signals output from the flag flip-flop 432(3) and the address flip-flop 452(3) are fed back to their respective inputs.

With reference to the read enable/reset logic circuit 470, XNOR gate 442(1) may compare whether the new address ADDX matches the ADD<1> address, and if so, may cause the flag flip-flop 432(1) to reset the FLG<1> signal to cause the ADD<1> address to be marked as invalid to avoid storage of duplicate addresses within the bubble break register 400. It is appreciated that the same principles for the read enable/reset logic circuit 570 apply to other similar logic circuits of the 440 to cause a reset of a corresponding FLG<3:0> signal in response to detection of a matching address.

While the bubble break register 400 depicted in FIG. 4 only depicts a single address flip-flip and single logical bit comparison for each slot, it is appreciated that the flag path circuit 430 and the address match logic circuit 440 may include additional circuitry to store and compare each bit or a subset of bits of an address to detect a match between addresses without departing from the scope of the disclosure. In addition, the address path circuit 450 may also include additional flip-flops for each slot to store each data bit corresponding to an address without departing from the scope of the disclosure. While the bubble break register 400 of FIG. 4 includes 4 slots, it is appreciated that the bubble break register 400 could be expanded to include any number of slots without departing from the scope of the disclosure.

Figure 5:
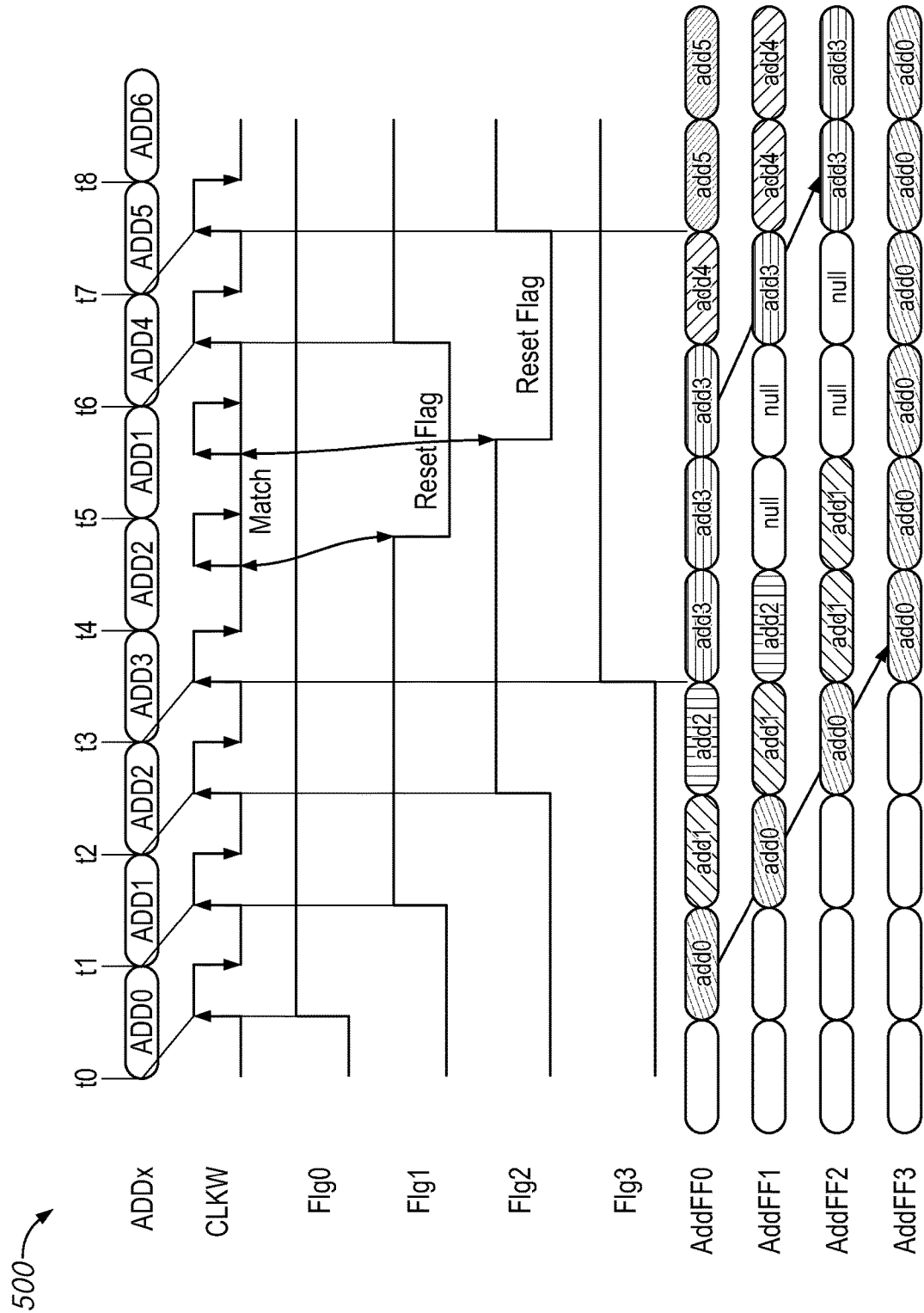
FIG. 5 includes an exemplary timing diagram of write accesses associated with a bubble break register, in accordance with an embodiment of the present disclosure.

FIG. 5 includes an exemplary timing diagram 500 of write accesses associated with a bubble break register, in accordance with an embodiment of the present disclosure. The timing diagram 500 may be implemented by the cold data detector circuit 132 of FIG. 1, the cold data detector circuit 222 of FIG. 2, any of the bank0-N cold data detectors 310(0)-(N) of FIG. 3, and/or the bubble break register 400 of FIG. 4. The ADDX signal, the CLKW signal, the FLG<3:0> signals, and the AddFF0-3 flip flops may correspond to the ADDX, the CLKW the FLG<3:0> signals, the ADDX address, and the address flip-flops 452(0)-(3), respectively, of FIG. 4. Times T0-T7 depict write operations associated with the bubble break register.

Between time T0 and T1, in response to the CLKW signal, a first address ADD0 is received on the ADDX signal at an input of a first flip-flop slot (e.g., AddFF0) of a bubble break register and the FLG<0> signal transitions to a high logical value. Between times T1 and T2, the ADD0 begins transitioning to an output of the first-flip-flop slot/input of the second flip-flop slot (e.g., ADDFF1) based on the CLKW signal, and accordingly, the FLG<1> signal transitions to a high logical value.

Also between times T1 and T2, in response to the CLKW signal, a second address ADD1 is received on the ADDX signal at the input of the first flip-flop slot. The FLG<0> signal remains at the high logical value because the respective slot continues to hold valid data. Between times T2 and T3, the ADD0 begins transitioning to an output of the second-flip-flop slot/input of the third flip-flop slot (e.g., ADDFF2) and the ADD1 begins transitioning to the output of the first flip-flop slot/input of the second flip-flop slot (e.g., ADDFF1) based on the CLKW signal. Accordingly, the FLG<2> signal transitions to a high logical value.

Also between times T2 and T3, in response to the CLKW signal, a third address ADD2 is received on the ADDX signal at the input of the first flip-flop slot. The FLG<0> signal, the FLG<1> signal, and the FLG<2> signal all remain at the high logical value because the respective slots continue to hold valid data. Between times T3 and T4, the ADD0 begins transitioning to an output of the third flip-flop slot/input of the fourth flip-flop slot (e.g., ADDFF3), the ADD1 begins transitioning to the output of the second-flip-flop slot/input of the third flip-flop slot, and the ADD2 begins transitioning to the output of the first flip-flop slot/input of the second flip-flop slot based the CLKW signal. Accordingly, the FLG<3> signal transitions to a high logical value.

Also between times T3 and T4, in response to the CLKW signal, a fourth address ADD3 is received on the ADDX signal at the input of the first flip-flop slot. The FLG<0> signal, the FLG<1> signal, the FLG<2>, and the FLG<3> signals all remain at the high logical value because the respective slots continue to hold valid data.

Between times T4 and T5, in response to the CLKW signal, the ADD2 address is received on the ADDX signal at an input of the first flip-flop slot. A match is detected with the ADD2 stored at the ADDFF1 slot, and accordingly, the FLG<1> signal is cleared.

Between times T5 and T6, in response to the CLKW signal, the ADD1 address is received on the ADDX signal at an input of the first flip-flop slot. A match is detected with the ADD1 stored at the ADDFF2 slot, and accordingly, the FLG<2> signal is cleared.

Between times T6 and T7, in response to the CLKW signal, the ADD4 address is received on the ADDX signal at an input of the first flip-flop slot. In response to the ADD4 address, the ADD3 begins transitioning to an output of the first flip-flop slot/input of the second flip-flop slot (e.g., ADDFF1), and the new ADD4 begins transitioning into the first flip-flop slot. Accordingly, the FLG<1> signal transitions to a high logical value. A match is detected with the ADD1 stored at the ADDFF2 slot, and accordingly, the FLG<2> signal is cleared. After time T7, ADD3 begins transitioning to an output of the second flip-flop slot/input of the third flip-flop slot (e.g., ADDFF2), the ADD2 begins transitioning to an output of the first flip-flop slot/input of the second flip-flop slot (e.g., ADDFF1), and the new ADD1 begins transitioning into the first flip-flop slot. Accordingly, the FLG<2> signal transitions to a high logical value.

Between times T7 and T8, in response to the CLKW signal, the ADD5 address is received on the ADDX signal at an input of the first flip-flop slot. In response to the ADD5 address, the ADD3 begins transitioning to an output of the second flip-flop slot/input of the third flip-flop slot (e.g., ADDFF2), the ADD4 begins transitioning to an output of the first flip-flop slot/input of the second flip-flop slot (e.g., ADDFF1), and the new ADD4 begins transitioning into the first flip-flop slot. Accordingly, the FLG<2> signal transitions to a high logical value. After time T8, in response to the CLKW signal, the ADD6 address is received on the ADDX signal at an input of the first flip-flop slot, but the bubble break register is full, so the address is ignored.

As previously noted, the timing diagram 500 is exemplary. The timing relationships are not intended to be to scale, and it is appreciated that other timing relationships may be realized without departing from the scope of the disclosure.

Figure 6:
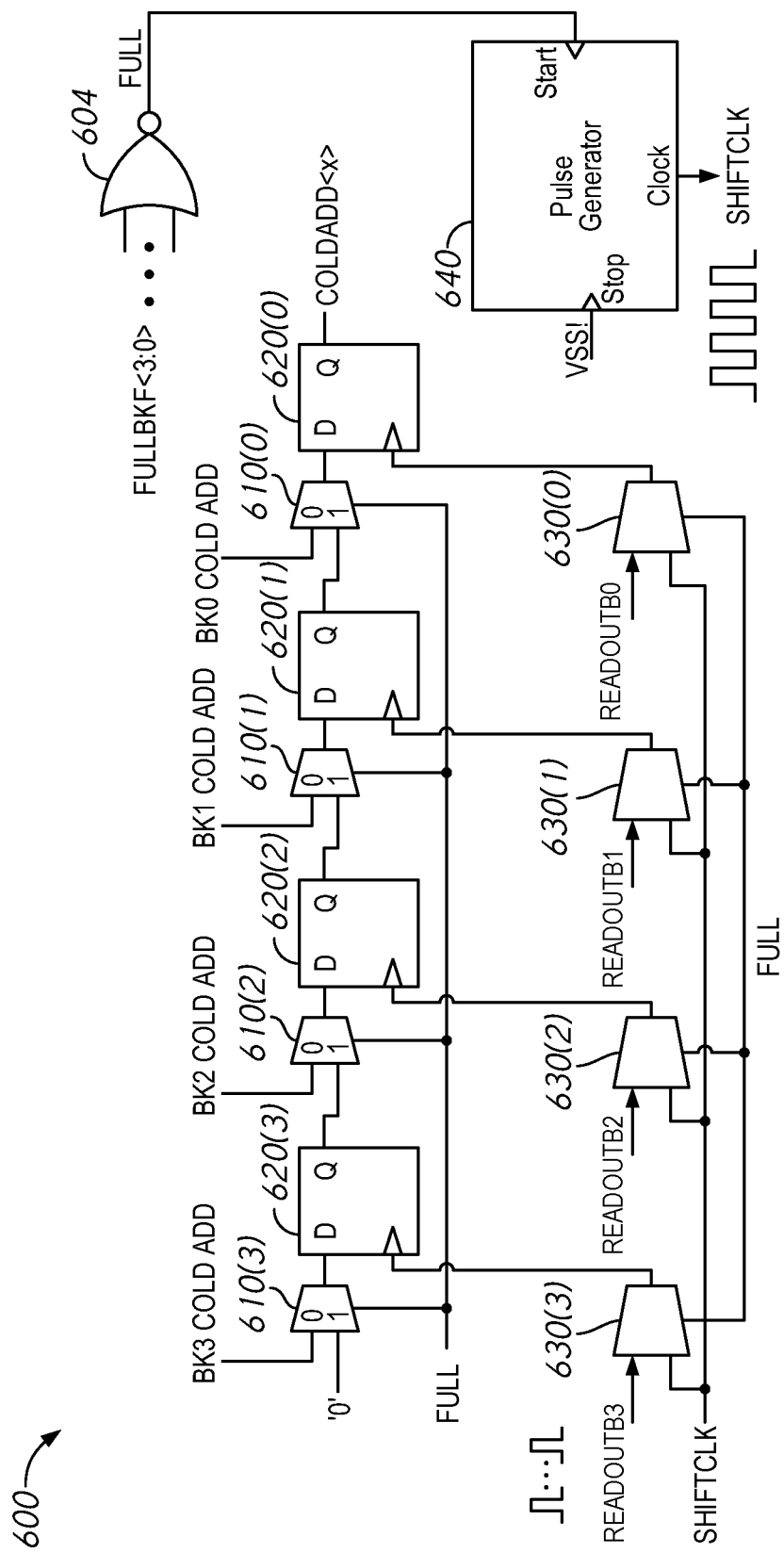
FIG. 6 is a block diagram of a cold data readout circuit, in accordance with an embodiment of the present disclosure.

FIG. 6 is a block diagram of a cold data readout circuit 600, in accordance with an embodiment of the present disclosure. The cold data readout circuit 600 includes a shift register having serially-coupled latch circuits 620(0)-(3) each configured to store a respective memory bank cold address BK0-3 COLD ADD. The shift register of the cold data readout circuit 600 may include a slot for each bank of a memory cell array, in some examples. While the cold data readout circuit 600 depicts 4 of the serially-coupled latch circuits 620(0)-(3) to support a 4-bank memory array, it is appreciated that the cold data readout circuit 600 could be expanded to accommodate memory arrays with more than 4 banks without departing from the scope of the disclosure. The shift register may include a slot for each bank of the N memory banks of the memory cell array. In some examples, the cold data detector circuit of the primary memory 130 of FIG. 1, the cold data readout circuit 271 of FIG. 2, and/or the cold data readout circuit 311 of FIG. 3 may implement the cold data readout circuit 600.

The cold data readout circuit 600 may further include multiplexers 610(0)-(3) selectively configured to provide one of a respective BK0-3 COLD ADD or an output of a preceding one of the serially-coupled latch circuits 620(0)- (2) (e.g., with an input to the multiplexer 610(3) being a null or zero input) to a subsequent one of the serially-coupled latch circuits 620(1)-(3). The multiplexers 610(0)-(3) may be controlled by a memory full signal FULL. The FULL signal may be set by a NOR gate 604 in response to each of the FULLBKF<3:0> signals indicating that a respective BANK0-3 is full. The BK0-3 cold addresses may be received from respective BANK0-3 cold data detectors (e.g., the BANK0-N cold data detectors 310(0)-(N) of FIG. 3).

The cold data readout circuit 600 may further include multiplexers 630(0)-(3) selectively configured to provide one of a respective READOUTB0-3 or a shift clock signal SHIFTCLK to a respective one of the serially-coupled latch circuits 620(0)-(3). The multiplexers 630(0)-(3) may be controlled by the FULL signal. Thus, when the FULL signal indicates that the memory is not yet hill, the multiplexers 610(0)-(3) may provide a respective BK0-3 cold address to an input of a respective one of the serially-coupled latch circuits 620(1)-(3), and the multiplexers 630(0)-(3) may be set to provide a respective READOUTB0-3 clock signal to a respective one of the serially-coupled latch circuits 620 (1)-(3) to cause the respective one of the serially-coupled latch circuits 620(1)-(3) to latch the respective BK0-3 cold address.

The cold data readout circuit 600 may further include a pulse generator 640 that is configured to provide the SHIFT-CLK signal based on a value of the FULL signal. The pulse generator 640 may be configured to cause the serially-coupled latch circuits 620(0)-(3) to shift the stored BK0-3 cold addresses from left to right such that each of the stored BK0-3 cold addresses are eventually provided at the cold address output COLDADD<x>. Thus, when the FULL signal indicates that the memory is full, the multiplexers 610(0)-(3) may serially couple the outputs of the serially-coupled latch circuits 620(0)-(2) to the inputs of the serially-coupled latch circuits 620(1)-(3), and the multiplexers 630 (0)-(3) may be set to provide the SHIFTCLK signal to each of the serially-coupled latch circuits 620(1)-(3) to cause each of the serially-coupled latch circuits 620(1)-(3) to re-latch with every pulse on the SHIFTCLK signal. The pulse generator 640 may be configured to provide a number of pulses on the SHIFTCLK signal equal to a number of the serially-coupled latch circuits 620(0)-(3).

Figure 7:
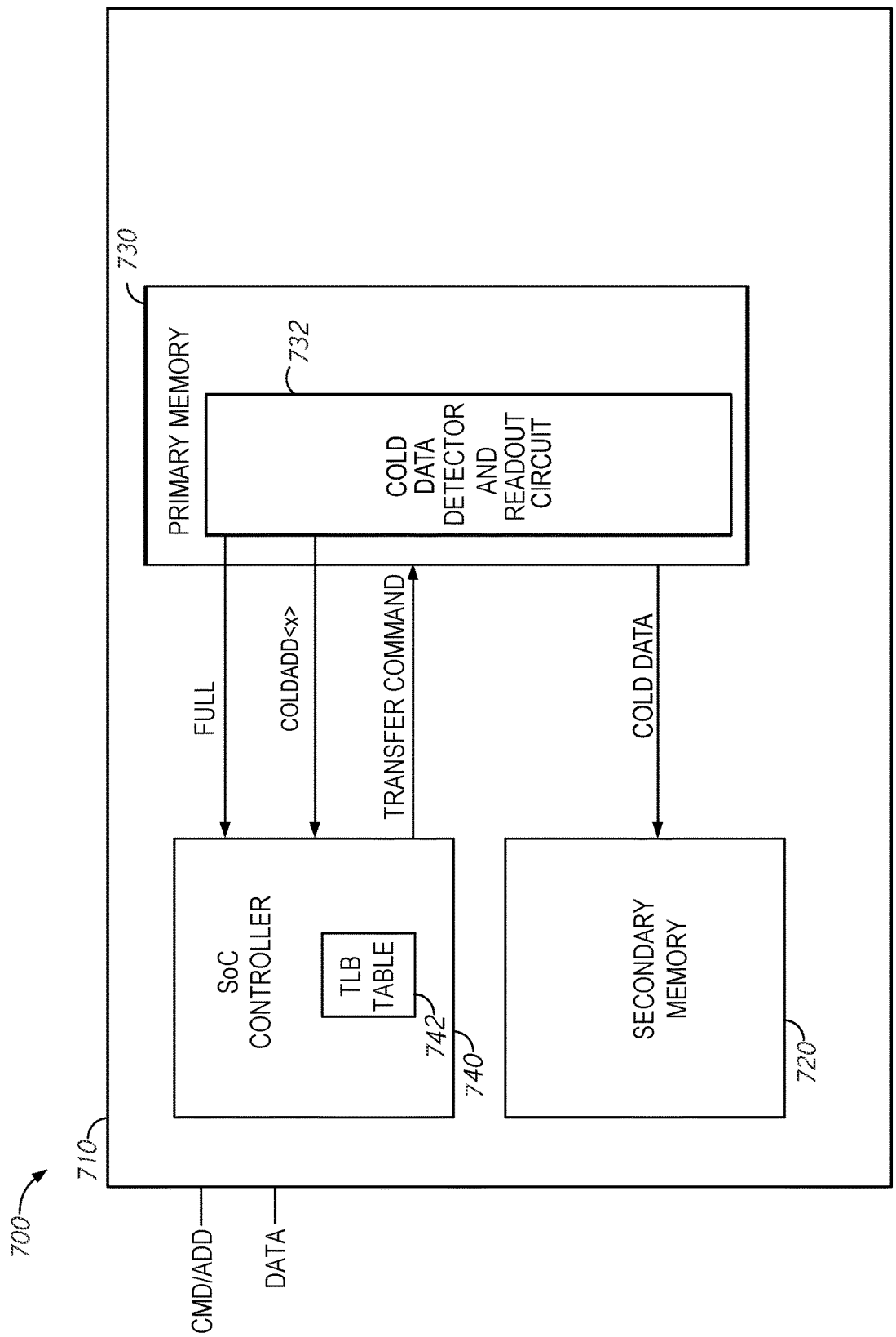
FIG. 7 is a block diagram of a system-on-a-chip memory system in accordance with an embodiment of the present disclosure.

FIG. 7 is a block diagram of a system-on-a-chip (SoC) memory system 700 in accordance with an embodiment of the present disclosure. The memory system 700 may include a semiconductor chip 710 having secondary memory 720 and primary memory 730, as well as a SoC controller 740 configured to a translation look-aside buffer (TLB) 742 to manage data storage locations between the secondary memory 720 and the primary memory 730 in order to route access requests to the correct memory. In some examples, the primary memory 730 may include volatile memory and the secondary memory 720 may include non-volatile memory. The memory module 110 of FIG. 1 may implement the semiconductor chip 710, in some examples. The primary memory 730 may implement the primary memory 130 of FIG. 1 and/or the semiconductor device 200 of FIG. 2 may implement the primary memory 730, and the secondary memory 120 of FIG. 1 may implement the secondary memory 720.

The SoC controller 740 may be configured to receive commands CMD, addresses ADD, and data from a host or memory controller (not shown) to perform access operations (e.g., reading, writing, etc.) for maintaining data on the memory system 700. The secondary memory 720 may include flash memory or another type of WM, and the primary memory 730 may include any type of DRAM, including double data rate (DDR) 3, DDR4, DDR5, low power DDR, graphics DDR, etc.

In some examples, when operating in a computing system, the primary memory 730 may be configured as a main memory configured to temporarily store data generated and consumed during processing tasks, and the secondary memory 720 may be configured as a secondary memory to provide supplemental and/or permanent storage should the primary memory 730 become full of stored data or fail. In this example, the primary memory 730 may be used to initially store data due to its lower access latency as compared with the secondary memory 720, and as the primary memory 730 fills up with data, the primary memory 730 may transfer some of the stored data to the secondary memory 720 for longer term storage directly via a command received from the SoC controller 740.

The primary memory 730 may include a cold data detector and readout circuit 732 that is configured to trigger a transfer of data to the secondary memory 720 based on a determination that the primary memory 730 is sufficiently full such that more space should be made available. In some examples, the cold data detector and readout circuit of the primary memory 130 of FIG. 1, the cold data detector 222 and/or the cold data readout circuit 271 of FIG. 2, the BANK0-N cold data detectors 301(0)-(N) and/or the cold data readout circuit 311 of FIG. 3, the cold data detector 400 of FIG. 4, and/or the cold data readout circuit 600 may be implemented in the cold data detector and readout circuit 732. At least two considerations for transferring data to the secondary memory 720 may include determining when to transfer the data and determining which data to transfer. In some examples, the cold data detector and readout circuit 732 may also designate which data to transfer to the secondary memory 720. Selecting which data to transfer may including identifying which data are likely to be accessed for further processing and which data are unlikely to be accessed for further processing. That is, to mitigate efficiency loss caused by the increased access latency of the secondary memory 720, it may be desirable to predict which data are hot data (e.g., data most likely to be requested for additional processing and which data are cold data (e.g., most likely to not experience imminent requests for further processing). In one example, hot data may be data that is new and/or frequently-accessed within the primary memory 730, and cold data may include older, less frequently accessed data.

The determination as to when to transfer the data from the primary memory 730 to the secondary memory 720 may be based on a determination by the cold data detector and readout circuit 732 as to when the primary memory 730 is sufficiently full (e.g., has reached a threshold) of stored data such that more memory space needs to be made to accommodate future data storage.

In some examples to address one or both of these considerations, the cold data detector and readout circuit 732 may include a bubble break register or buffer architecture (e.g., the bubble break register of the cold data detector 400 of FIG. 4) that is configured to capture and store access information indicating which segments or sections of a bank of a main memory are currently storing cold (e.g., older data). By its nature, the bubble break register architecture may be capable of indicating which segment of the main memory includes cold data in response to a determination by a control circuit that each segment of a bank has been accessed at least one time.

The bubble break register of the cold data detector and readout circuit 732 may include a form of a shift register, but may make complete use of the register by selectively shifting received data to fill empty slots without having to wait until the empty slots are shifted out an end slot. The bubble break register may include a flag circuit that includes a respective flag corresponding to each slot in the register. Each respective flag may be configured to indicate whether a particular slot in the register currently holds a valid segment address or not. Thus, for a particular slot, the respective flag indicates whether a segment address stored in the respective address circuit is valid. When the respective flag for the particular slot indicates that the segment address is not valid (e.g., an empty slot or a bubble in the register), a shift of a new segment address into the register may result in the empty slot being filled by shifting existing segment addresses from preceding slots by one such that a first end slot becomes available to shift in the new segment address, while subsequent slots storing valid segment addresses remain unaffected.

For example, in a register may include four segment address slots, with all slots holding valid segment addresses except the third slot. When a new segment address is received, a segment address from the second slot may shift to fill the empty third slot, a segment address from the first slot may shift to replace the data in the second slot, and the new segment address may shift into the first slot. The fourth slot may remain unaffected by the shift in this example.

In some examples, the bubble break register of the cold data detector and readout circuit 732 may be utilized to store a limited subset of segment addresses for a bank of the memory array a semiconductor device. When a new segment address matching a previously-stored segment address is received, the previously-stored segment address may be invalidated (e.g., by setting or clearing the corresponding flag), and the new segment address may be shifted into the register. Invalidating the previously-stored segment address may cause that previously-stored segment address to be overwritten. In some examples, the size of the bubble break register (e.g., number of slots) may be based on a number of segments in a main memory.

When every slot of the register is filled, every flag may indicate every slot has a valid segment address. The control circuit may to the bubble break register may cause the bubble break register to provide cold address data at an output in response to detection of at least one access of every segment in a bank. The control circuit may include a respective latch circuit for each segment in a bank, a logic gate to detect when each latch is set, and a pulse generator to cause the bubble break register to provide a cold address from the bubble break register. Each individual latch may be set in response to receipt of a corresponding segment address activation. In some examples, the coldest data may be determined based on the segment address stored in the last slot of the bubble break register.

The cold address data output from the bubble break register for a bank may be provided to and stored at a shift register of the cold data detector and readout circuit 732. The shift register may include a slot for each bank of the primary memory 730, and in response to each slot being filled, a logic circuit of the cold data detector and readout circuit 732 may send a full signal FULL, along with cold data addresses <x> to the SoC controller 740. In response, the SoC controller 740 issue a transfer command to the primary memory 730 to initiate a direct transfer of the cold data associated 730 to the secondary memory 720. The SoC controller 740 may also update the TLB 742 to reference the location of the transferred cold data in the secondary memory 720.

Using the bubble break register architecture in the cold data detector circuit of the primary memory 730 to determine when to trigger a transfer of data from the primary memory 730 to the secondary memory 720, as well as to determine which data to transfer, my provide a more efficient mechanism to manage storage at the primary memory 730 as compared with counters and other conventional circuitry implemented for this purpose.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
    a memory cell array comprising a plurality of banks, wherein a bank of the plurality of banks includes a respective plurality of segments each associated with a respective segment address; and
    a cold data detector circuit corresponding to the bank of the plurality of banks and comprising a register having a plurality of slots configured to store received segment addresses, wherein, in response to detection that each of the respective plurality of segments of the bank has had at least one access operation, the cold data detector circuit is configured to provide a longest stored segment address from the register to an output as a cold address, wherein each bank of the plurality of banks corresponds to a respective cold data detector circuit.

2. The apparatus of claim 1, wherein, during an access operation associated with a target segment of the respective plurality of segments, each slot of a plurality of slots preceding a particular slot of the plurality of slots of the register indicated as empty is shifted by one slot to fill the particular slot such that a first end slot of the plurality of slots is made available to receive the respective target segment address associated with the target segment.

3. The apparatus of claim 2, wherein each slot of the plurality of slots subsequent to the particular slot retains existing respective segment addresses.

4. The apparatus of claim 2, wherein, during the access operation associated with the target segment of the respective plurality of segments, the cold data detector circuit is configured to compare the respective segment addresses stored at register with the respective target segment address, wherein, in response to a determination that one of the respective segment addresses stored at register matches the respective target segment address, the cold data detector circuit is configured to invalidate the one of the respective segment addresses stored at register and to store the respective target segment address at the register.

5. The apparatus of claim 1, further comprising a cold data readout circuit having a shift register configured to store the cold address is a particular location.

6. An apparatus comprising:
a memory cell array comprising a plurality of banks, wherein a bank of the plurality of banks includes a respective plurality of segments each associated with a respective segment address; and
a cold data detector circuit corresponding to the bank of the plurality of banks and comprising a register having a plurality of slots configured to store received segment addresses, wherein, in response to detection that each of the respective plurality of segments of the bank has had at least one access operation, the cold data detector circuit is configured to provide a longest stored segment address from the register to an output as a cold address, wherein the memory cell array further includes a second cold data detector circuit corresponding to a second bank of the plurality of banks, wherein the second cold data detector circuit includes a second register with a second plurality of slots configured to store received segment addresses associated with a respective plurality of segments of the second bank, wherein, in response to detection that each of the respective plurality of segments of the second bank has had at least one access operation, the second cold data detector circuit is configured to provide a longest stored segment address from the second register to an output as a second cold address.

7. An apparatus comprising:
a memory cell array comprising a plurality of banks, wherein a bank of the plurality of banks includes a respective plurality of segments each associated with a respective segment address;
a cold data detector circuit corresponding to the bank of the plurality of banks and comprising a register having a plurality of slots configured to store received segment addresses, wherein, in response to detection that each of the respective plurality of segments of the bank has had at least one access operation, the cold data detector circuit is configured to provide a longest stored segment address from the register to an output as a cold address; and
a plurality of cold data detector circuits, including the cold data detector circuit, each corresponding to a respective bank of the plurality of banks, wherein, in response to detection that each of the respective plurality of segments of the respective bank has had at least one access operation, each of the plurality of cold data detector circuits is configured to provide a respective longest stored segment address from the respective register as a respective cold address; and
a cold data readout circuit having a shift register having a plurality of slots each configured to store the respective cold address from a particular one of the plurality of cold data detector circuits, wherein the cold data readout circuit is configured to initiate the transfer of cold data from the memory cell array to another memory in response to receipt of a bank full signal from each of the plurality of cold data detectors.

8. The apparatus of claim 7, wherein the cold data readout circuit is further configured to update a mode register in response to the cold data being transferred from the memory cell array to another memory.

9. The apparatus of claim 7, wherein the memory cell array includes volatile memory cells.

10. The apparatus of claim 7, wherein the another memory includes a non-volatile memory.

11. An apparatus comprising:
a first memory having a first access latency;
a second memory having a second access latency that is less than the first access latency, wherein the second memory comprises a memory cell array comprising a plurality of banks, wherein each of the plurality of banks includes a respective plurality of segments each associated with a respective segment address, the second memory further comprising a plurality of cold data detector circuits each corresponding to a respective one of the plurality of banks and each comprising a respective register, wherein each of the respective registers is configured to store segment addresses, wherein, in response to detection that each segment of a particular bank has been targeted for at least one access operation, the respective cold data detector of the plurality of cold data detectors is configured to provide a respective longest-stored segment address from the respective register to a cold data readout circuit, wherein the cold data readout circuit is provide an indication to transfer cold data from the first memory to the second memory in response to receipt of the respective longest-stored segment address from each of the plurality of cold data detectors.

12. The apparatus of claim 11, wherein a depth of the respective register of one of the plurality of cold data detectors is less than a count of the respective plurality of segments in a bank of the plurality of banks corresponding to the one of the plurality of cold data detectors.

13. The apparatus of claim 11, wherein the cold data readout circuit comprises a shift register having a plurality of slots each configured to store the respective longest-stored segment address from a particular one of the plurality of cold data detectors.

14. The apparatus of claim 11, wherein the first memory and the second memory are part of a memory module or a system-on-a chip.

15. The apparatus of claim 11, wherein the first memory is a non-volatile memory and the second memory is a volatile memory.

16. A method comprising:
storing segment addresses at a register of a cold data detector circuit during access operations associated with a bank of a memory cell array having a plurality of segments, wherein the segment addresses are each associated with a respective segment of the plurality of segments;
in response to detection that each of the plurality of segments of the bank has been accessed, transfer a longest stored segment address to a cold data readout circuit as a cold address; and
in response to receipt of a corresponding longest stored segment address from each of a plurality of registers corresponding to a plurality of banks of the memory cell array, initiating the transfer of cold data from the memory cell array to another memory.

17. The method of claim 16, further comprising, during an access operation associated with a target segment of the plurality of segments, shifting each slot of a plurality of slots preceding a particular slot of the plurality of slots of the register indicated as empty by one slot to fill the particular slot such that a first end slot of the plurality of slots is made available to receive the respective target segment address associated with the target segment.

18. The method of claim 17, further comprising, during the access operation associated with the target segment of the plurality of segments:
   comparing the respective segment addresses stored at register with the respective target segment address; and
   in response to a determination that one of the respective segment addresses stored at register matches the respective target segment address, invaliding the one of the respective segment addresses stored at register and storing the respective target segment address at the register.

19. The method of claim 16, further comprising, in response to the detection that each of the plurality of segments of the bank has been accessed, providing the respective segment address stored in a last slot of the register as the longest-stored segment address.

20. The method of claim 16, wherein the memory cell array includes non-volatile memory cells and the another memory includes a non-volatile memory.

\* \* \* \* \*